US010304618B2

(12) United States Patent
Park et al.

(10) Patent No.: US 10,304,618 B2
(45) Date of Patent: May 28, 2019

(54) ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 3 days.

(21) Appl. No.: 15/229,346

(22) Filed: Aug. 5, 2016

(65) Prior Publication Data

US 2017/0103847 A1    Apr. 13, 2017

(30) Foreign Application Priority Data

Oct. 8, 2015    (KR) .................... 10-2015-0141565

(51) Int. Cl.
*H01F 5/00*    (2006.01)
*H01F 27/29*    (2006.01)
(Continued)

(52) U.S. Cl.
CPC ....... *H01F 27/292* (2013.01); *H01F 17/0013* (2013.01); *H01F 17/04* (2013.01); *H05K 1/181* (2013.01)

(58) Field of Classification Search
CPC .................................................. H01F 27/292
See application file for complete search history.

(56) References Cited

U.S. PATENT DOCUMENTS 6,191,933 B1 * 2/2001 Ishigaki ................. H01G 4/232
361/309
6,201,682 B1 * 3/2001 Mooij .................... H01C 7/006
338/313

(Continued)

FOREIGN PATENT DOCUMENTS

JP    2002-184648 A    6/2002
JP    3847265 B2    11/2006
(Continued)

*Primary Examiner* — Ronald Hinson
(74) *Attorney, Agent, or Firm* — Morgan Lewis & Bockius LLP

(57) ABSTRACT

An electronic component includes an inductor including an inductor body and first and second external electrodes, the first and second external electrodes including first and second body portions and first and second band portions extended from the first and second body portions to portions of an upper surface of the inductor body in a thickness direction, respectively; and first and second metal frames including first and second upper horizontal portions bonded to the first and second band portions, respectively, first and second lower horizontal portions disposed below the inductor body to be spaced apart from each other, and first and second vertical portions connecting end portions of the first and second upper horizontal portions and end portions of the first and second lower horizontal portions to each other and disposed to be spaced apart from the first and second body portions, respectively.

17 Claims, 6 Drawing Sheets

(51) Int. Cl.
  *H05K 1/18*   (2006.01)
  *H01F 17/00*  (2006.01)
  *H01F 17/04*  (2006.01)

(56) References Cited

U.S. PATENT DOCUMENTS

| | | | |
|---|---|---|---|
| 6,940,708 B2 * | 9/2005 | Yoshii | H01G 2/065 |
| | | | 361/303 |
| 6,958,899 B2 * | 10/2005 | Togashi | H01G 2/065 |
| | | | 361/303 |
| 2008/0186652 A1 | 8/2008 | Lee et al. | |
| 2015/0022937 A1 | 1/2015 | Park et al. | |
| 2015/0054388 A1 * | 2/2015 | Itagaki | H01C 7/008 |
| | | | 310/364 |

FOREIGN PATENT DOCUMENTS

| | | | |
|---|---|---|---|
| JP | 2014-127523 A | 7/2014 |
| KR | 10-2008-0073193 A | 8/2008 |
| KR | 10-2015-0010181 A | 1/2015 |

* cited by examiner

ELECTRONIC COMPONENT AND BOARD HAVING THE SAME

CROSS-REFERENCE TO RELATED APPLICATION

This application claims the benefit of priority to Korean Patent Application No. 10-2015-0141565, filed on Oct. 8, 2015 with the Korean Intellectual Property Office, the entirety of which is incorporated herein by reference.

BACKGROUND

The present disclosure relates to an electronic component and a board having the same.

Acoustic noise is commonly generated in an inductor due to magnetostriction of a core material, caused by the magnetic force applied to the inductor by the formation of a magnetic field upon the application of a current, or it may be caused by the vibrations of the core and the coil.

In existing inductors, acoustic noise has been a matter of little concern. However, recently, as the application of high levels of current has rapidly increased due to the multifunctionalization of electronic components, rapid charging of a battery, and the like, acoustic noise has emerged as a new concern in the area of inductors.

Particularly, in order to decrease acoustic noise in inductors, there is a need to consider the vibration of the entire inductor body due to vibrations of the core and the coil in addition to the vibrational displacement of surfaces generated by magnetostriction.

SUMMARY

An aspect of the present disclosure provides an electronic component capable of decreasing acoustic noise of an inductor, and a board having the same.

According to an aspect of the present disclosure, an electronic component includes: an inductor including an inductor body and a pair of external electrodes disposed on both end portions of the inductor body in a length direction, respectively; and a pair of metal frames respectively connected to the pair of external electrodes, wherein each of the pair of metal frames has an upper horizontal portion connected to an upper surface of a band portion of the external electrode, a perpendicular portion extended from the upper horizontal portion to a lower surface of the inductor body, and a lower horizontal portion, the perpendicular portion and the lower horizontal portion being disposed to be spaced apart from the inductor body, and a board having the same.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
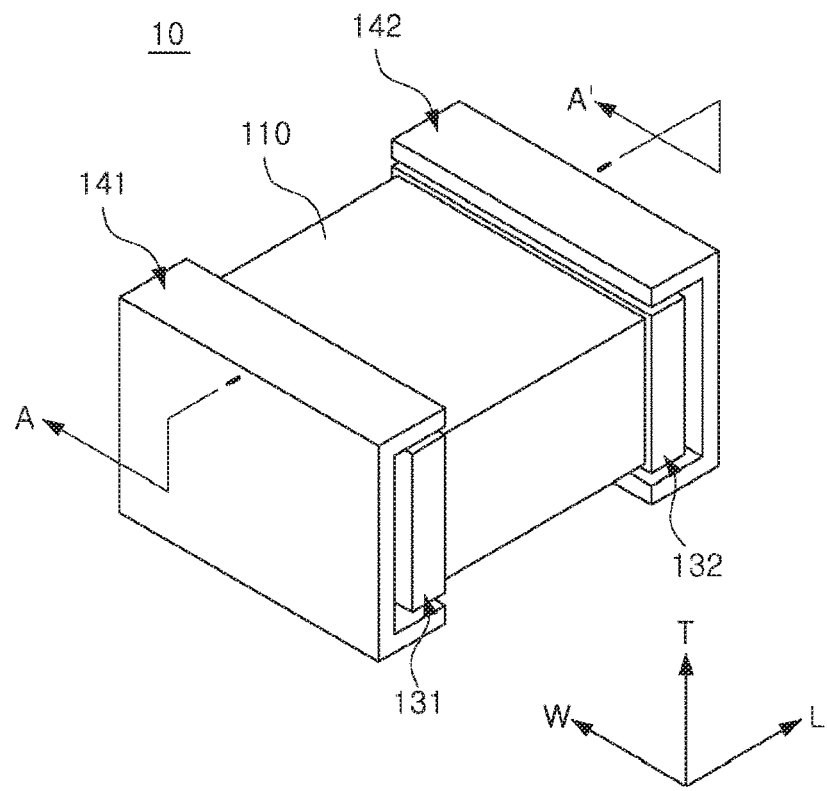
FIG. 1 is a perspective view schematically illustrating an electronic component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Directions of a hexahedron will be defined in order to clearly describe exemplary embodiments in the present disclosure. L, W and T illustrated in the accompanying drawings refer to a length direction, a width direction, and a thickness direction, respectively.

Figure 2:
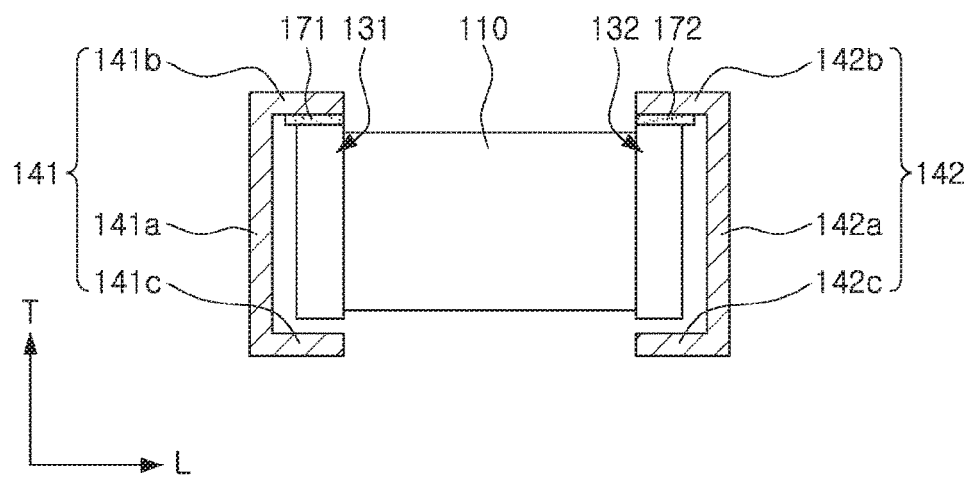
FIG. 2 is a front view of FIG. 1.
Figure 3:
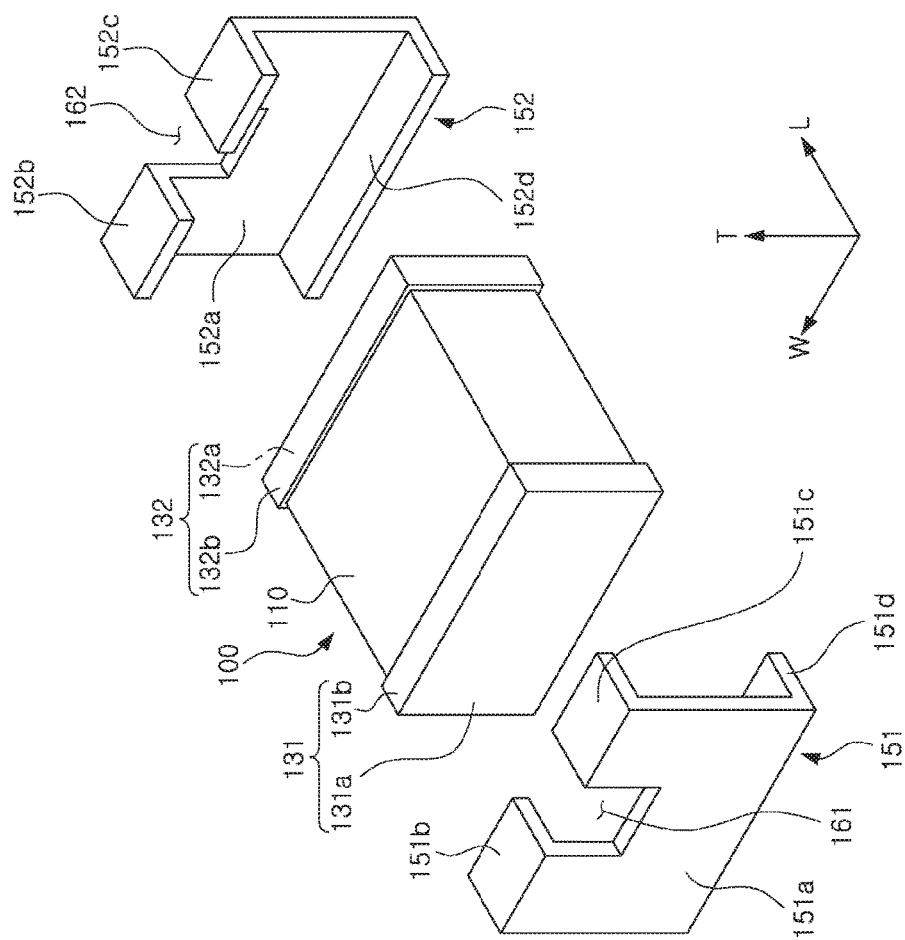
FIG. 3 is a separate perspective view illustrating a metal frame of the electronic component of FIG. 1 according to another exemplary embodiment.

FIG. 1 is a perspective view schematically illustrating an electronic component according to an exemplary embodiment in the present disclosure, FIG. 2 is a front view of FIG. 1, and FIG. 3 is a separate perspective view illustrating another example of a metal frame of the electronic component of FIG. 1.

Referring to FIGS. 1 through 3, an electronic component 10 according to the present exemplary embodiment may include an inductor 100, and first and second metal frames 141 and 142.

The inductor 100 may include an inductor body 110 and first and second external electrodes 131 and 132 disposed on first and second end portions of the inductor body 110 in the length direction.

The inductor body 110 may contain a metal magnetic material. However, the inductor body 110 is not necessarily limited thereto, and may contain any magnetic material as long as it has magnetic properties.

The metal magnetic material may be a crystalline or amorphous metal powder containing one or more selected from the group consisting of iron (Fe), silicon (Si), boron (B), chromium (Cr), aluminum (Al), copper (Cu), niobium (Nb), and nickel (Ni).

The inductor body 110 as described above may have a hexahedral shape. However, a shape of the inductor body 110 is not limited thereto.

The first and second external electrodes 131 and 132 may be formed by sintering a conductive paste containing silver (Ag) in order to provide high reliability such as excellent heat cycle resistance, moisture resistance, and the like, while having excellent electrical properties, but the material of the first and second external electrodes 131 and 132 is not limited thereto.

Plating layers (not illustrated) may be formed on the first and second external electrodes 131 and 132. The plating layers may include first and second nickel (Ni) plating layers each formed on the first and second external electrodes 131 and 132 and first and second tin (Sn) plating layers each formed on the first and second nickel plating layers, as an example.

The first and second external electrodes 131 and 132 may include first and second body portions 131a and 132a and first and second band portions 131b and 132b, respectively.

In the first and second external electrodes 131 and 132, the first and second body portions 131a and 132a may be portions disposed on first and second surfaces of the inductor body 110 in the length direction, respectively, and the first and second band portions 131b and 132b may be portions extended from the first and second body portions 131a and 132a to portions of an upper surface of the inductor body 110 in the thickness direction, respectively.

In this case, the first and second band portions 131b and 132b may be extended from the first and second body portions 131a and 132a to portions of a lower surface of the inductor body 110 in the thickness direction and portions of both surfaces of the inductor body 110 in the width direction, respectively.

The first and second metal frames 141 and 142 may include first and second upper horizontal portions 141b and 142b, first and second lower horizontal portions 141c and 142c, and first and second vertical portions 141a and 142a, respectively.

The first upper horizontal portion 141b may be a portion bonded to an upper surface of the first band portion 131b to serve to electrically connect the inductor 100 and the first metal frame 141 to each other.

In this case, a first conductive adhesive layer 171 may be disposed between the first band portion 131b and the first upper horizontal portion 141b, and may serve to improve adhesion strength between the first upper horizontal portion 141b and the first band portion 131b.

The first lower horizontal portion 141c may be a portion disposed below the inductor body 110, and may serve as a mounting portion connected to a circuit board at the time of mounting the electronic component on the circuit board.

In this case, the first lower horizontal portion 141c may be surface-treated by nickel/tin or nickel/gold plating, or the like, so as to have excellent contact properties with the solders at the time of mounting the electronic component on the circuit board.

Further, the first lower horizontal portion 141c may be disposed to be spaced apart from the lower surface of the inductor body 110 and the first external electrode 131.

The first vertical portion 141a may be a portion connecting an end portion of the first upper horizontal portion 141b and an end portion of the first lower horizontal portion 141c to each other, and may be disposed to be spaced apart from the first body portion 131a of the first external electrode 131.

Therefore, since the first metal frame 141 and the first external electrode 131 contact each other only through the first upper horizontal portion 141b and the upper surface of the first band portion 131b, vibrations of an upper portion of the inductor may be only partially transferred through the first metal frame 141, such that acoustic noise may be decreased.

The second upper horizontal portion 142b may be a portion bonded to an upper surface of the second band portion 132b to serve to electrically connect the inductor 100 and the second metal frame 142 to each other.

In this case, a second conductive adhesive layer 172 may be disposed between the second band portion 132b and the second upper horizontal portion 142b, and may serve to improve adhesion strength between the second upper horizontal portion 142b and the second band portion 132b.

The second lower horizontal portion 142c may be a portion disposed below the inductor body 110, and may serve as a mounting portion connected to the circuit board at the time of mounting the electronic component on the circuit board.

In this case, the second lower horizontal portion 142c may be surface-treated by nickel/tin or nickel/gold plating, or the like, so as to have excellent contact properties with the solders at the time of mounting the electronic component on the circuit board.

Further, the second lower horizontal portion 142c may be disposed to be spaced apart from the lower surface of the inductor body 110 and the second external electrode 132.

The second vertical portion 142a may be a portion connecting an end portion of the second upper horizontal portion 142b and an end portion of the second lower horizontal portion 142c to each other, and may be disposed to be spaced apart from the second body portion 132a of the second external electrode 132.

Therefore, since the second metal frame 142 and the second external electrode 132 contact each other only through the second upper horizontal portion 142b and the upper surface of the second band portion 132b, vibrations of an upper portion of the inductor may be only partially transferred through the second metal frame 142, such that acoustic noise may be decreased.

That is, the first metal frame 141 may have a substantially '[' shape in which a groove is formed toward the first external electrode 131 in the accompanying drawing, and the second metal frame 142 may have a substantially ']' shape in which a groove is formed toward the second external electrode 132 in the accompanying drawing.

Further, the first and second metal frames 141 and 142 may absorb and alleviate vibrations generated by formation of a magnetic field of the inductor by elastic force to decrease mechanical strength transferred from the inductor body 110 to the circuit board, thereby decreasing acoustic noise. Therefore, defects such as cracks, or the like, occurring in the inductor body 110 or damages may be prevented, such that reliability may be improved.

In another exemplary embodiment in the present disclosure, the first and second metal frames may have groove portions, respectively.

For example, as illustrated in FIG. 3, in a first metal frame 151, a portion connecting a first vertical portion 151a and a first upper horizontal portion to each other may be cut off, thereby forming a first groove portion 161. That is, the first groove portion 161 may be a portion formed by partially cutting off the first upper horizontal portion and the first vertical portion 151a.

In a case in which a groove portion is formed in a first lower horizontal portion 151d, at the time of mounting the electronic component on a circuit board, an area of an electrical connection portion and a mounting area for securing adhesion strength may be decreased. Therefore, the groove part may not be formed in the first lower horizontal portion 151d, but rather as described in the above-mentioned example.

The first lower horizontal portion 151d may secure sufficient rigidity to increase resistance against vibrations transferred through the first upper horizontal portion and the first vertical portion 151a, thereby partially blocking vibrations transferred to the circuit board.

In this case, the first upper horizontal portions 151b and 151c may be divided into two portions by the first groove portion 161 in the width direction.

When the first groove portion 161 is formed in the first metal frame 151 as described above, a vibration transfer area may be decreased due to a decrease in a bonding area between the first upper horizontal portions 151b and 151c and the first vertical portion 151a of the first metal frame 151. Vibrations transferred from the first external electrode 131 may be decreased, and thus, acoustic noise may be decreased.

Further, vibrations may be more effectively suppressed by suppressing a contact with a maximum vibration portion, and maximum vibrations are generated in a central portion of the first band portion 131b.

In a second metal frame 152, a portion connecting a second vertical portion 152a and a second upper horizontal portion to each other may be cut off, thereby forming a second groove portion 162.

That is, the second groove portion 162 may be a portion formed by partially cutting off the second upper horizontal portion and the second vertical portion 152a.

In a case in which a groove portion is formed in a second lower horizontal portion 152d, at the time of mounting the electronic component on a circuit board, an area of an electrical connection portion and a mounting area for securing adhesion strength may be decreased. Therefore, the groove part may not be formed in the second lower horizontal portion 152d, but rather as described in the above-mentioned example.

The second lower horizontal portion 152d may secure sufficient rigidity to increase resistance against vibrations transferred through the second upper horizontal portion and the second vertical portion 152a, thereby partially blocking vibrations transferred to the circuit board.

In this case, the second upper horizontal portions 152b and 152c may be divided into two portions by the second groove portion 162 in the width direction.

When the second groove portion 162 is formed in the second metal frame 152 as described above, a bonding area disposed between the second upper horizontal portions 151b and 151c and the second vertical portion 152a of the second metal frame 152 to become vibration media may be decreased, such that vibrations transferred from the second external electrode 132 may be decreased, and thus, acoustic noise may be decreased.

Further, vibrations may be more effectively suppressed by suppressing a contact with a maximum vibration portion, and maximum vibrations are generated in a central portion of the second band portion 132b.

Figure 4:
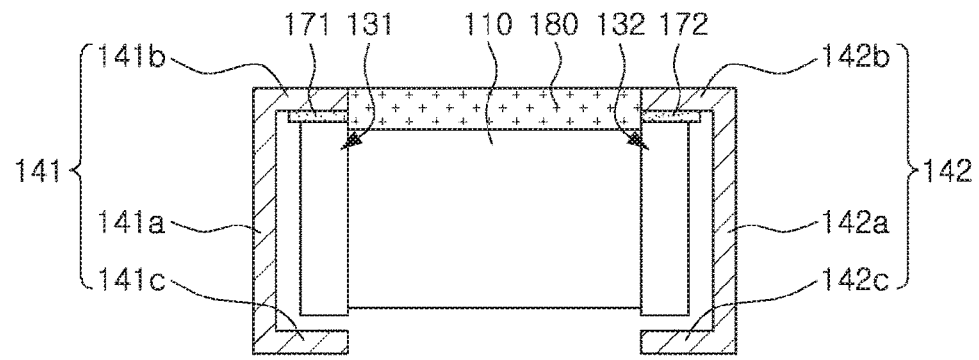
FIG. 4 is a front view of an electronic component according to another exemplary embodiment in the present disclosure.

Referring to FIG. 4, an insulating part 180 may be disposed on an upper surface of an inductor body 110.

The insulating part 180 may be disposed between first and second band portions 131b and 132b.

The insulating part 180 may be formed of an insulating material such as an epoxy resin, a ceramic material, or the like, but is not limited thereto.

Further, the insulating part 180 may decrease a chipping defect in the inductor body which may occur during a manufacturing process.

Further, a nozzle may contact the upper surface of the inductor body to pick up an electronic component in order to use the electronic component. In this case, the insulating part 180 may decrease impact at the time of contacting the nozzle, thereby improving product durability. Further, the insulating part may serve to increase bonding strength between first and second metal frames 141 and 142 and the inductor body 110.

The inductor used in the electronic component according to the present disclosure may be one of a winding type inductor, a multilayer-type inductor, and a thin film-type inductor.

Figure 5:
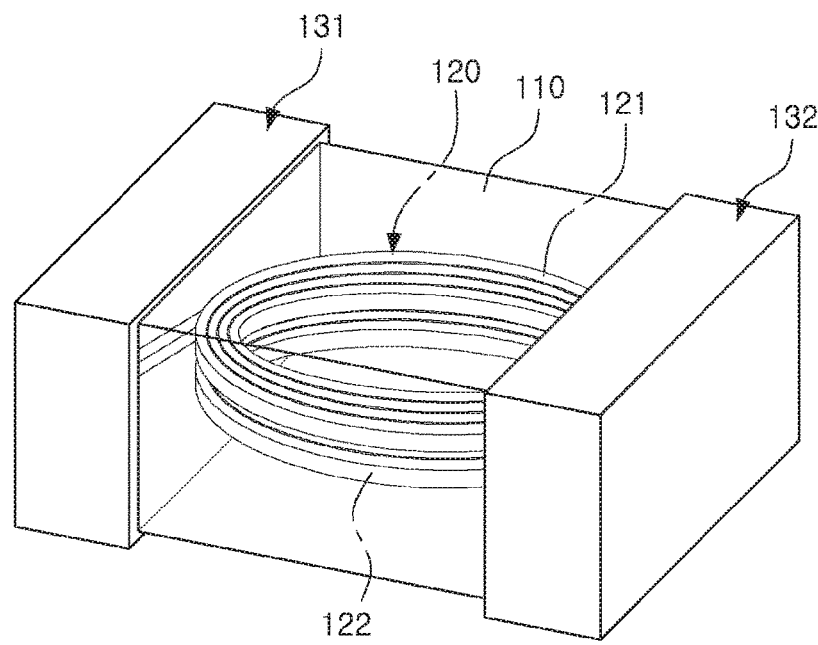
FIG. 5 is a transparent perspective view illustrating an example of an inductor used in the electronic component according to the present disclosure.
Figure 6A:
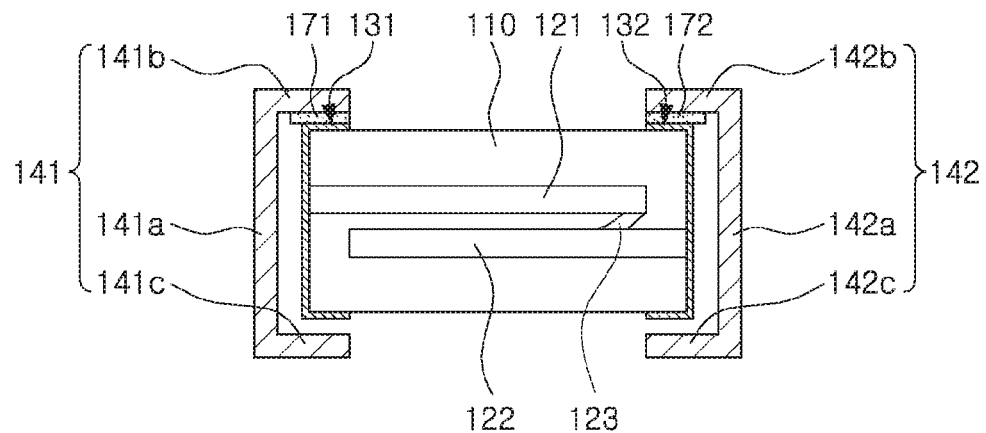
FIG. 6A is a side cross-sectional view illustrating an electronic component in which the inductor of FIG. 5 is disposed parallel to a mounting surface.

Referring to FIGS. 5 and 6A, a winding type inductor used in the electronic component according to the present disclosure may include, for example, a coil 120 disposed in a spiral shape in the inductor body 110. In FIG. 6A, a reference numeral 123 indicates a connection portion connecting upper and lower coils 121 and 122 to each other.

In this case, end portions of the upper and lower coils 121 and 122 may be exposed to first and second surfaces of the inductor body 110 in the length direction, respectively, to thereby be electrically connected to the first and second body portions 131a and 132a of the first and second external electrodes 131 and 132, respectively.

In addition, the coil 120 may be disposed in the inductor body parallel to the lower horizontal portions 141c and 142c, which are mounting portions.

Figure 6B:
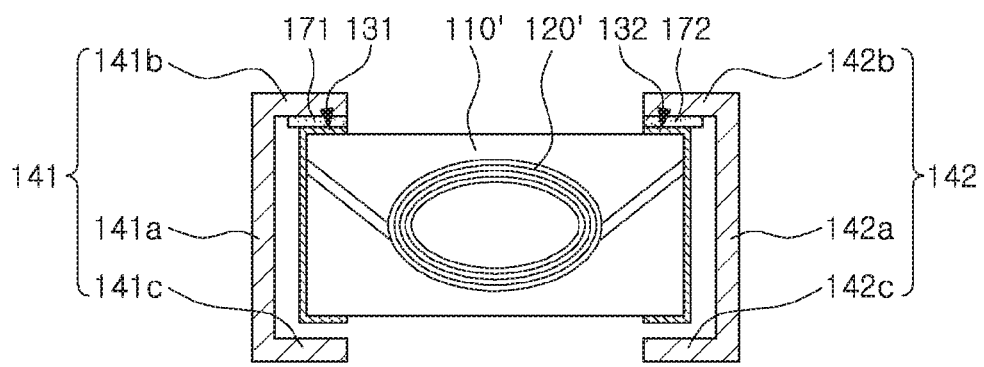
FIG. 6B is a side cross-sectional view illustrating an electronic component in which the inductor of FIG. 5 is disposed perpendicularly to a mounting surface.

Referring to FIG. 6B, a coil 120' may be disposed in an inductor body 110' perpendicularly to the lower horizontal portions 141c and 142c, which are mounting portions.

In a case in which the coil 120' is perpendicularly disposed in the inductor body 110' as in the present exemplary embodiment, since the smallest vibration displacement is generated in portions in which first and second external electrodes 131 and 132 of the inductor and first and second upper horizontal portions 141b and 142b of first and second metal frames 141 and 142 are bonded to each other, acoustic noise may be more effectively decreased.

Figure 7:
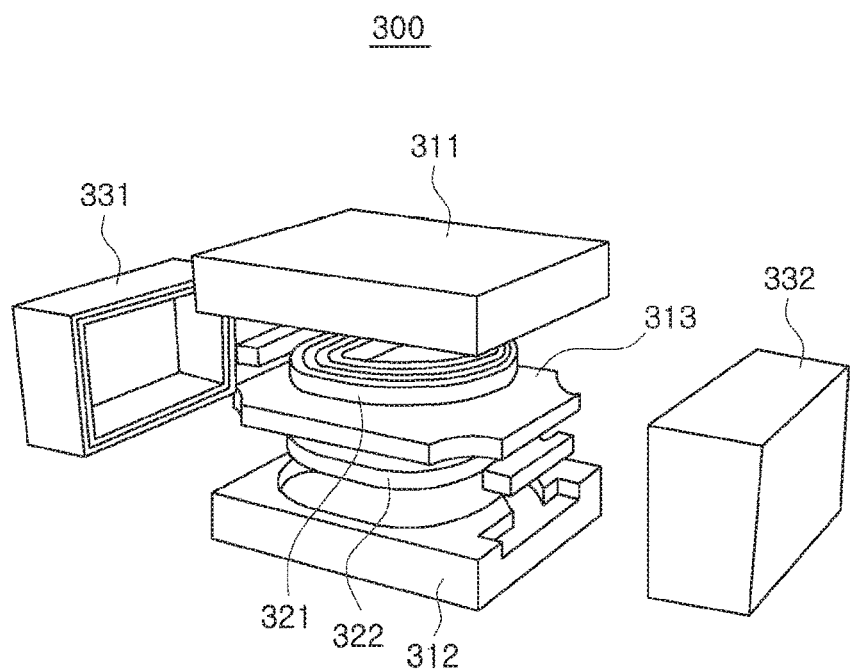
FIG. 7 is a transparent perspective view illustrating another example of the inductor used in the electronic component according to the present disclosure.

Referring to FIG. 7, a thin film-type inductor 300 used in the electronic component according to the present disclosure may include, for example, an insulating substrate 313 and upper and lower coil parts 321 and 322 disposed on upper and lower surfaces of the insulating substrate 313, respectively, and an inductor body 110 may be formed by stacking magnetic sheets 311 and 312 on the upper and lower surfaces of the insulating substrate 313 so as to cover the upper and lower coil parts 321 and 322, and compressing and curing the stacked magnetic sheets 311 and 312.

In this case, the upper and lower coil parts 321 and 322 may be electrically connected to each other through a via (not illustrated) disposed to penetrate through the insulating substrate 313, or the like.

Further, one end portion of the upper coil part 321 may be exposed to one surface of the inductor body 110 in a length direction to thereby be electrically connected to the first external electrode 331.

One end portion of the lower coil part 322 may be exposed to the other surface of the inductor body 110 in the length direction to thereby be electrically connected to the second external electrode 332.

Figure 8:
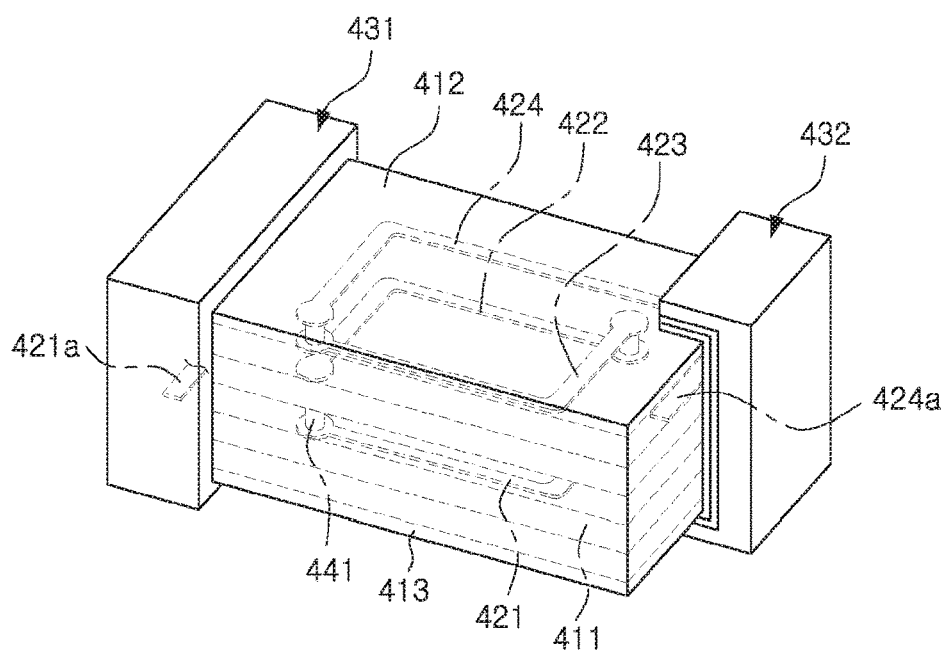
FIG. 8 is a transparent perspective view illustrating another example of the inductor used in the electronic component according to the present disclosure.

Referring to FIG. 8, a multilayer-type inductor used in the electronic component according to the present disclosure may be manufactured by stacking a plurality of magnetic sheets 411 in a thickness direction, and compressing the stacked magnetic sheets 411, and conductive patterns 421 to 424 may be disposed on one of the surfaces of the magnetic sheets, respectively. Among the conductor patterns 421 to 424, conductor patterns adjacent to each other in the thickness direction may be connected by a via penetrating through the magnetic sheet 411 to have exposed upper and lower end portions, thereby being electrically connected to each other.

In this case, cover layers 412 and 413 may be disposed on and below uppermost and lowermost insulating sheets 411, respectively. The cover layers 412 and 413 may be formed by stacking a sheet having the same configuration as that of the magnetic sheet except that the conductor pattern is not disposed.

The conductor patterns 421 to 424 may be formed of a conductive metal. For example, the conductor patterns 421 to 424 may be formed of a material such as copper (Cu), a copper (Cu) alloy, or the like, but are not limited thereto.

In this case, the conductor patterns 421 and 424 may be electrically connected to the first and second external electrodes 431 and 432, respectively.

For example, the conductor patterns 421 and 424 disposed on lowermost and uppermost layers may have first and second lead portions 421a and 424a exposed to first and second surfaces of the inductor body 110 in the length direction, respectively, in order to be connected to the first and second body portions 431a and 432a of the first and second external electrodes 431 and 432.

Board Having Electronic Component

Figure 9:
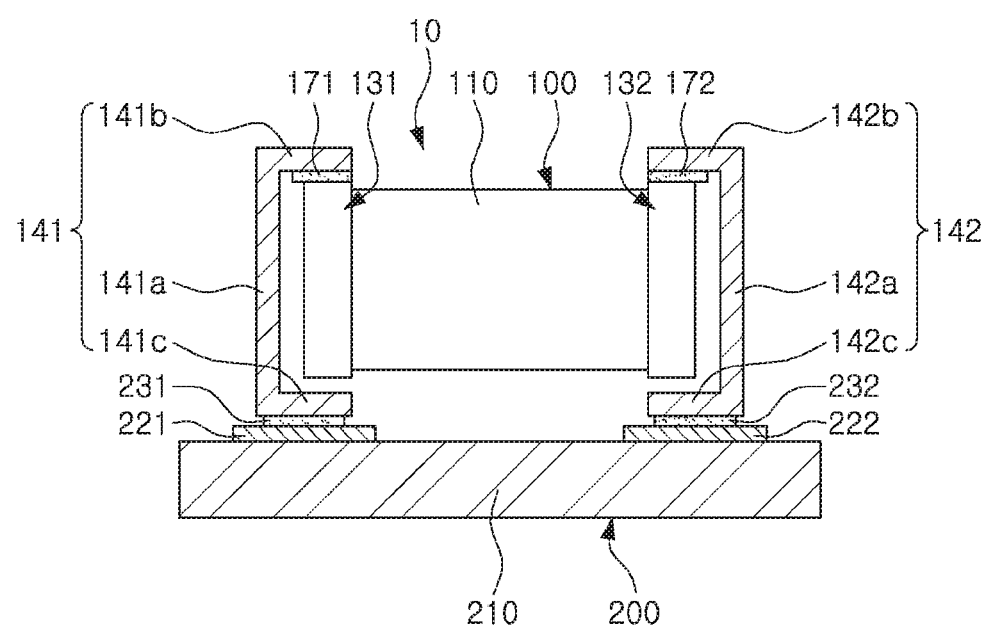
FIG. 9 is a front view schematically illustrating a board in which the electronic component of FIG. 1 is mounted on a circuit board.

FIG. 9 is a front view illustrating a board in which the electronic component of FIG. 1 is mounted on a circuit board.

Referring to FIG. 9, a board 200 having an electronic component according to the present exemplary embodiment may include a circuit board 210 on which the electronic component 10 including the inductor 100 is mounted, and first and second electrode pads 221 and 222 formed on an upper surface of the circuit board 210 to be spaced apart from each other.

The electronic component 10 may be bonded to the circuit board 210 by first and second bonding members 231 and 232 disposed between the first and second lower horizontal portions 141c and 142c of the first and second metal frames 141 and 142 and the first and second electrode pads 221 and 222 and formed of a conductive adhesive material to thereby be electrically connected to the circuit board 210 in a state in which the first and second lower horizontal portions 141c and 142c of the first and second metal frames 141 and 142 are positioned to contact the first and second electrode pads 221 and 222, respectively.

According to the present exemplary embodiment, piezoelectric vibrations transferred to the circuit board 210 through the first and second external electrodes 131 and 132 of the inductor 100 may be absorbed by the first and second metal frames 141 and 142 using elasticity, and mechanical stress generated due to warparge of the circuit board 210, or the like, may also be absorbed by the first and second metal frames 141 and 142, such that acoustic noise may be decreased.

A structure according to the present disclosure may be applied to information technology (IT) devices such as mobile phones, or the like, in which acoustic noise is a significant issue, to decrease acoustic noise, and in a case in which the structure is applied to a vehicle module requiring high reliability, or the like, the first and second metal frames may distribute heat to alleviate thermal shock, thereby preventing problems such as solder cracks, or the like.

As set forth above, according to exemplary embodiments in the present disclosure, the metal frames may be disposed to be bonded to the upper surfaces of the band portion of the external electrodes, and vibrations transferred through the external electrodes of the inductor body may be absorbed by elastic force of the metal frame, such that acoustic noise may be decreased.

Further, since the metal frame may distribute heat, thermal shock occurring at the time of operating the product may be alleviated, such that reliability of the product may be improved.

While exemplary embodiments have been shown and described above, it will be apparent to those skilled in the art that modifications and variations could be made without departing from the scope of the present invention as defined by the appended claims.

What is claimed is:

1. An electronic component comprising:
   an inductor including an inductor body and first and second external electrodes disposed on first and second surfaces of the inductor body in a length direction, respectively, the first and second external electrodes including first and second body portions and first and second band portions extended from the first and second body portions to portions of an upper surface of the inductor body in a thickness direction, respectively;
   first and second metal frames including first and second upper horizontal portions bonded to the first and second band portions, respectively, first and second lower horizontal portions disposed below the inductor body and spaced apart from each other, and first and second vertical portions connecting end portions of the first and second upper horizontal portions and end portions of the first and second lower horizontal portions to each other and disposed to be spaced apart from the first and second body portions, respectively; and
   an insulating part disposed on the upper surface of the inductor body between the first and second band portions,
   wherein the first and second metal frames contact the first and second external electrodes only through the first and second upper horizontal portions, respectively, and
   a topmost sulfate of each of the first and second upper horizontal portions is coplanar with a topmost surface of the inductor.

2. The electronic component of claim 1, further comprising first and second conductive adhesive layers disposed between the first and second band portions and the first and second upper horizontal portions, respectively.

3. The electronic component of claim 1, wherein the first and second lower horizontal portions are disposed to be spaced apart from a lower surface of the inductor body.

4. The electronic component of claim 1, wherein the first and second band portions are extended from the first and second body portions to portions of a lower surface of the inductor body in the thickness direction and portions of both surfaces of the inductor body in a width direction, respectively.

5. The electronic component of claim 1, wherein the insulating part is formed of an epoxy resin or a ceramic material.

6. The electronic component of claim 1, wherein the inductor is a multilayer-type inductor.

7. The electronic component of claim 1, wherein the inductor is a thin film-type inductor.

8. A board having an electronic component, comprising:
   a circuit board on which first and second electrode pads are provided;
   the electronic component of claim 1, mounted on the circuit board such that the first and second lower horizontal portions thereof are connected to the first and second electrode pads, respectively; and
   first and second bonding members bonding the first and second electrode pads and the first and second lower horizontal portions to each other, respectively.

9. The electronic component of claim 1, wherein the first and second metal frames each have a groove portions.

10. The electronic component of claim 9, wherein the groove portions are formed in portions of the first and second metal frames connecting the first and second upper horizontal portions to the first and second vertical portions, respectively.

11. The electronic component of claim 1, wherein the inductor is a winding type inductor.

12. The electronic component of claim 11, wherein the winding type inductor includes a coil disposed to be parallel to a mounting surface.

13. The electronic component of claim 11, wherein the winding type inductor includes a coil disposed to be perpendicular to a mounting surface.

14. An electronic component comprising:
   an inductor including an inductor body and first and second external electrodes disposed on an upper surface of the inductor body and spaced apart from each;
   first and second metal frames each including an upper horizontal portion bonded to the first and second external electrodes, a vertical portion extending along side surfaces of the inductor body and spaced apart from the side surfaces of the inductor body, and a lower horizontal portion extending along a lower surface of the inductor and spaced apart from the lower surface of the inductor; and
   an insulating part disposed on the upper surface of the inductor body between the first and second band portions,
   wherein the first and second metal frames contact the first and second external electrodes only through the first and second upper horizontal portions, respectively, and
   a topmost most surface of each of the first and second upper horizontal portions is coplanar with topmost su fact of the inductor.

15. The electronic component of claim 14, further comprising first and second conductive adhesive layers disposed between the upper horizontal portions and the first and second external electrodes, respectively.

16. The electronic component of claim 14, wherein the first and second metal frames each have a groove portions.

17. The electronic component of claim 14, further comprising an insulating part disposed on an upper surface of the inductor body between the first and second external electrodes.

* * * * *